United States Patent [19]

Tsipenyuk et al.

[11] Patent Number: 4,604,796
[45] Date of Patent: Aug. 12, 1986

[54] IC EXTRACTOR TOOL

[75] Inventors: Pyotr Tsipenyuk, Bronx; Marvin Kober, Spring Valley, both of N.Y.

[73] Assignee: O.K. Industries Inc., New York, N.Y.

[21] Appl. No.: 739,708

[22] Filed: May 31, 1985

[51] Int. Cl.⁴ .............................................. H05K 3/32
[52] U.S. Cl. .......................................... 29/764; 29/758
[58] Field of Search .......... 29/764, 741, 758, 837–839, 29/278

[56] References Cited

U.S. PATENT DOCUMENTS

| | | |
|---|---|---|
| 3,516,142 | 6/1970 | De Rose et al. ................. 29/764 X |
| 3,570,096 | 3/1971 | Sosinski ................................. 29/764 |
| 4,215,468 | 8/1980 | Greco ..................................... 29/764 |

*Primary Examiner*—Carl E. Hall

[57] ABSTRACT

An IC component extraction hand tool, especially for PCCs in a socket, comprising a base member for engaging the socket, a handle on the base member, and a resilient wire mounted to the handle and passing through holes in the base member and having hook ends which upon actuation of the wire can be caused to engage the component during an extraction operation.

9 Claims, 4 Drawing Figures

IC EXTRACTOR TOOL

This invention relates to extractor tools for integrated circuit components (ICs), and in particular to extractor hand tools for extracting ICs packaged in plastic chip carriers (PCCs) from printed circuit board (PCB) mounted sockets.

BACKGROUND OF THE INVENTION

The typical PCC socket is a square or rectangular body with an inner cavity lined with contacts for receiving and contacting the IC contacts when the latter is pushed into the socket. In opposite corners of the rectangular wall bounding the cavity are provided slots by means of which the inserted IC can be extracted from the cavity.

A known extraction tool is of the gear-puller type, and comprises two legs which fit into the slots and engage the bottom of the PCC, mounted on a frame which engages the socket, and a screw mechanism for lifting the legs relative to the frame. Such construction is expensive to manufacture, and requires two hands when used, and is otherwise cumbersome to operate.

BRIEF DESCRIPTION OF THE INVENTION

The principal object of the invention is an IC extraction tool characterized by low cost manufacture and ease of use.

Another object of the invention is an IC extraction tool especially adapted for extraction of PCCs from sockets, which tool can be manufactured at low cost and will be easy to use, preferably requiring only one hand.

The tool of the invention, briefly stated, comprises a base member configured to fit over the socket, a handle for manipulating the base member, and actuable means mounted to the handle for vertical movement relative to the base member. The actuable means is connected to hook ends positioned to engage and enter the socket extractor slots when the actuable means is actuated, cooperating with means for moving the hook ends inwardly to engage the PCC when the actuable means is again actuated, whereupon the PCC can be extracted by lifting on the handle and actuable means.

BRIEF DESCRIPTION OF DRAWINGS

Other features and advantages of the tool of the invention will become apparent from the detailed description that follows hereinafter with respect to the annexed drawings, of which.

DETAILED DESCRIPTION OF PREFERRED EMBODIMENT

Figure 1:
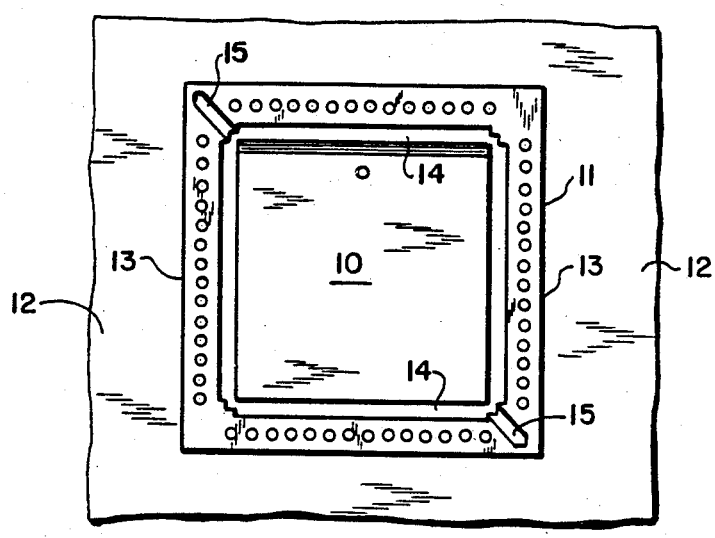
FIG. 1 is a plan view of a PCC in a socket on a PCB.

Referring now to the drawings, FIG. 1 shows a typical configuration of a PCC 10 mounted in a socket 11 in turn mounted on a PCB 12. Other components usually surrounding the PCC are omitted for the sake of simplicity. The socket 11 comprises an annular wall 13, square in this case, bounding a cavity 14 in which seats the square PCC 10. Extractor slots 15 are provided at diagonally opposite corners of the socket to facilitate removal of the PCC 10.

Figure 2:
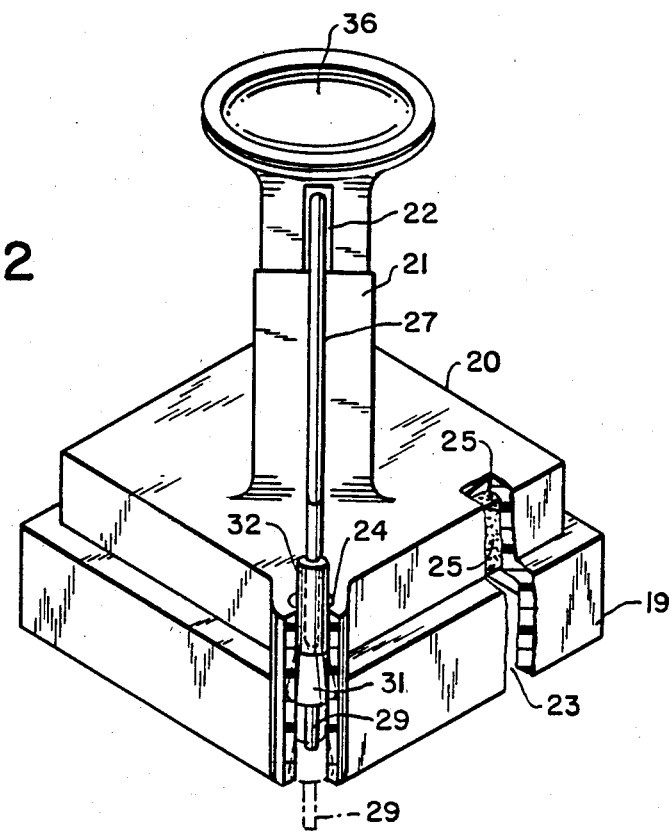
FIG. 2 is a perspective view of one form of the tool of the invention.

A preferred embodiment of the tool of the invention is illustrated in FIG. 2, and comprises a base member 20 comprising a depending skirt portion 19 bounding on its lower surface an inner cavity 23 configured to match that of the PCC socket 11. Thus, the cavity 23 is in this case square in outline and is dimensioned so that the tool can be positioned over the socket 11 which will fit within cavity 23 so as to align the tool relative to the socket. Extending upward from and integral with the base member 20 upper surface is a fixed handle and knob 21,36, provided with a slot 22 about two-thirds up from the upper surface of the base member 20. The base member 20 also has two guide holes 24 at diagonally-opposed corners, which holes 24 preferably are round, and which extend between the base upper surface and its lower surface within the cavity 23. Within the base and exposed to the cavity 23 is located a cushion insert 25.

The movable part of the tool is constituted by an actuable member, preferably in the form of a rounded spring wire or similar resilient element 27, generally U-shaped, whose center passes through the slot 22 in the handle 21 and whose ends each extend through one of the corner guide holes 24 and terminate in an inwardly directed hook end 29. The handle and knob 36 thus supports the actuable member 27 and together with the slot 22 also controls the direction and extent of its vertical motion. Extending between each hook end 29 and the wire 27 is a tapered connecting portion 30 positioned so that vertical movement of the wire or actuable member 27 will cause transverse movement of the hook ends 29.

Figure 3:
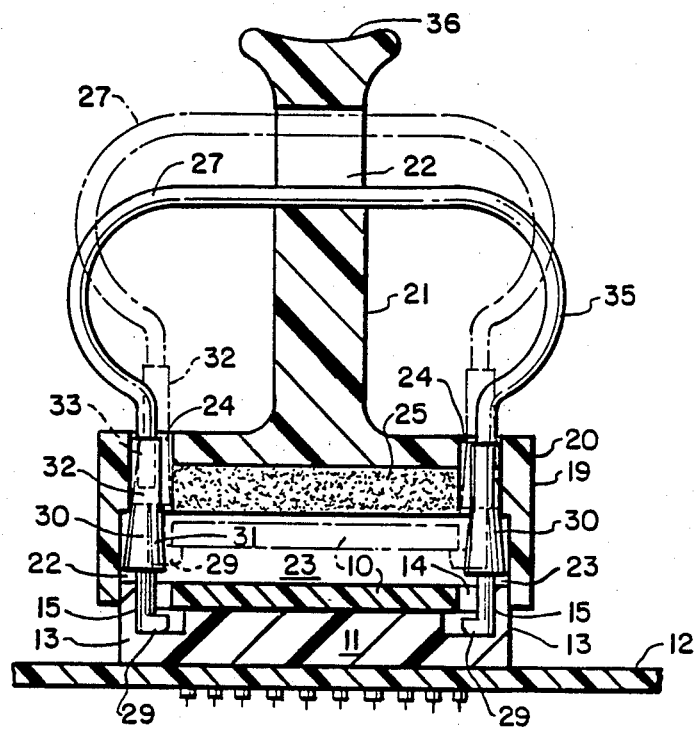
FIG. 3 is a partly cross-sectional view of the tool of FIG. 2 shown in its down operating position on the socket of FIG. 1.

The base member 20, integral with the handle 21 and knob 36, is preferably made of plating-grade plastic, such as ABS, a well known nitrile based plastic which can be chrome-plated (not shown) and is thus given an electrically conductive exterior. The spring wire is preferably made of resilient stainless steel, bent in the form shown so that it is outwardly biased, i.e., it tries to expand, thus urging the wire ends outwardly against the walls of the guide holes 24 as shown in FIG. 3. The hook ends 29 are likewise of stainless steel with a widened upper section comprising a bottom truncated conical shape 31 merging into a hollow cylindrical section 32 into which the wire end 33 is inserted and fastened as by crimping or with an adhesive. The cushion 25 is of an electrically conductive foam plastic held resiliently at the bottom side of the base member 20 or by means of an adhesive.

Figure 4:
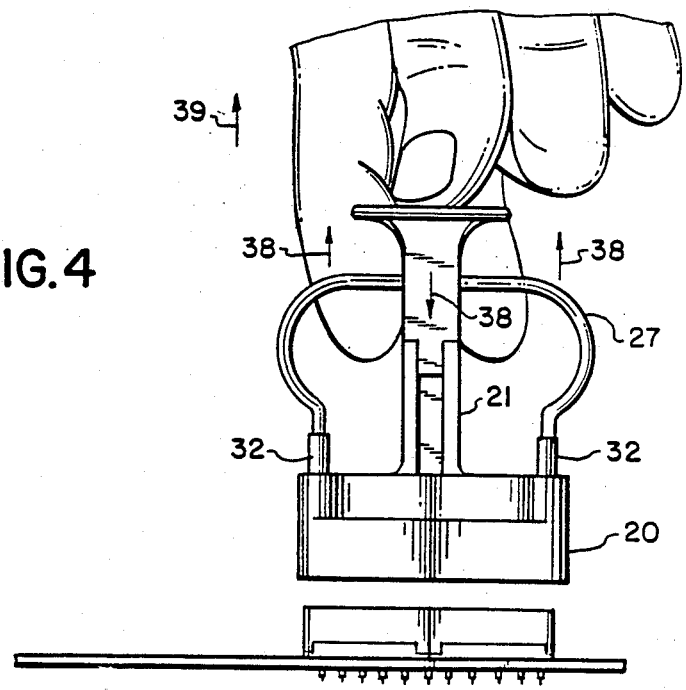
FIG. 4 is a schematic view illustrating operation of the tool.

The preferred way of operating the extractor tool of the invention, especially to remove a PCC from a socket on a crowded PCB, is as follows. While the tool is separated from the socket, the spring 27 wire is pushed downward until it is stopped by the bottom of the slot 22, to a first lower position as shown in solid lines in FIG. 3. The hook ends 29 thus protrude below the base 20, also shown in phantom in FIG. 2, which makes it easier to insert them into the socket slots 15. Next, the tool is held by one hand with thumb and forefinger holding the spring 27 between them at its upper widest part 35. The tool is then placed over the socket 11 and the hook ends 29 inserted into the socket slots 15 and pushed down until the hook ends rest on the socket bottom, as shown in FIG. 3; this is done without squeezing the spring wire 27, as the latter could cause inward movement of the hook ends 29 which would thus cause the hook ends to hit the IC 10 rather than bypass the IC to reach the socket bottom. Next, the handle 21, which is widened at the top to form the knob 36 for this purpose, is pushed down positioning the base member over the socket and allowing the depending skirt portion 19 to engage the outer periphery 13 of the socket and bring the latter within the cavity 23. During this motion, the base remains aligned with the socket due to the cooperation of the guide holes 24 with the cylindrical portion 32 of the connector 30. The base stops when the tapered section 31 reaches the guide holes 24. Then, with the user's thumb pressing downward on the knob top 36 to hold the tool in place, the forefinger and middle finger of the same user's hand are slipped under the spring wire portions adjacent the knob 21 and the spring wire 27 is pulled up with the two fingers while the thumb still presses downward. This is illustrated in FIG. 4, with the arrows 38 indicating the forces applied. This causes the spring 27 to move upward in its holding slot 22. As the hook ends ends 29 move upward, the conical connections 31 engaging the side walls of the holes 24 cam the hook ends 29 inward and under the PCC bottom. When the hook ends engage the PCC 10, further upward movement of the spring 27 to its second upper position shown in FIG. 4, in phantom in FIG. 3, and in solid lines in FIG. 2 will lift the PCC slightly from its socket 10 to a small extent. This action loosens the PCC from the socket. Then the entire tool is lifted upwardly shown by arrow 39 in FIG. 4 carrying the PCC with it and separating completely the PCC from the socket. The thus freed PCC can be released from the tool by again pushing the spring downward. The cushion insert 25 acts as a shock absorber should the PCC be pulled up and hit the cavity bottom. Its conductive nature, in contact with the electrically conductive plated exterior and interior of the base member, upon engagement with the PCC contributes to the prevention of static charge buildup, which can be further enhanced by connecting a clip lead between the spring 27 and a ground point of the PCB or its supporting chassis.

The tool of the invention as described offers many advantages. The plastic construction provides for low-cost manufacture by molding, and the metal plating ensures adequate electrical conductivity which is useful to protect static sensitive components, such as MOS ICs. The conductive foam cushion contributes to the latter feature, and in addition acts as a shock absorber on upward movement of the PCC. The construction of the base member to surround and engage the outer periphery of the socket assists in aligning the tool with the socket and in inserting the hooks in the socket slots. This alignment of the hooks with the socket slots is also assisted by the round guide holes in the base member which also provide economic, simple camming surfaces. The tapered connectors for the spring to the hook ends is inexpensive and in a very simple manner provides the necessary camming action to move the hook ends laterally inwardly when the spring is lifted. The one-hand operation in which the thumb pushes downward while the fingers lift the spring makes it unnecessary to hold the PCB or socket down while removing the the PCC, and use of two-fingers lifting ensures that the lifting force is applied evenly and with minimum effort required of the user. Thus it will be evident that the tool of the invention constitutes an important and useful contribution to the electronic arts.

Although the construction described above is preferred, various modifications and alternatives within the principles described will be apparent to those skilled in the art. For example, if the PCC has a different outline, then the shape of the base member could be correspondingly altered to fit. Further, instead of self-biased steel wire for the spring 27, it could be constructed of resilient plastic with sufficient resilience to provide the small outward biasing force required, or even one or more small compression springs mounted between the arms of the U to provide the outward biasing force. In addition, the base and knob could be constructed of metal, though this would be more expensive and result in a heavier tool than use of the preferred plated plastic.

Other modifications will readily suggest themselves to the skilled artisan and are not to be considered outside the scope of this invention except to the extent limited by the appended claims.

What is claimed is:

1. An extraction tool for PCC components mounted in a socket, comprising a base member having upper and lower surfaces and openings extending between the upper and lower surfaces, said base member having a square or rectangular configuration defining by side walls at its lower surface a cavity configured to receive the socket when the base member is placed over the socket and to engage and align the base member with the socket, said base member's openings being constituted by holes located at diagonally opposed corners of the rectangular base member and extending between its upper and lower surfaces and terminating within the cavity, a handle member connected to the base member's upper surface, hook means movably mounted in the base member's openings and extending below the base member's lower surface in such manner as to be positioned adjacent the component in the socket when the base member is engaged and aligned with the socket, and actuable means connected to the hook means and mounted to the handle for moving, in a first position of the actuable means, the hook means to a position alongside but laterally spaced from the component, and including means for camming the hook ends laterally inwardly when the actuable means is moved from its first to a second position, said camming means comprising a tapered member connected to the hook means and located within the holes and engaging the hole wall surface such that upward movement of the hook means cams the hook ends laterally inwardly so as to cause the hook ends to engage the component, said actuable means comprising a generally U-shaped member whose ends are each connected to one of the hook means, said U-shaped member being resiliently biased laterally outwardly tending to move the hook means away from the component, said hook means being positioned to enter diagonally located slots at the socket corners for accessing the bottom of the component, whereby upon lifting of the base member by the handle when the actuable member is in its second position the component can be extracted from the socket.

2. An extraction tool for PCC components mounted in a socket as claimed in claim 1, wherein the holes in the base member are round and the tapered member is conical.

3. An extraction tool for a PCC component mounted in a socket having diagonally-directed slots located outwardly of the component and at the socket corners for accessing the component bottom; said extraction tool comprising a base member having upper and lower surfaces with a square or rectangular configuration defining by side walls at its lower surface a cavity configured to receive the socket when the base member is placed over the socket and to engage and align the base member with the socket, said base member also having openings located at diagonally opposed corners and extending between its upper and lower surfaces and terminating within the cavity in a position aligned with the socket slots when the base member is placed over the socket, a handle member connected to the base member's upper surface, hook means movably mounted in the base member's openings and extendable below the base member's lower surface and configured in such manner as to enter the socket slots and be positioned adjacent the component bottom in the socket when the base member is engaged and aligned with the socket, means for resiliently biasing laterally outwardly the hook means tending to move the hook means away from the component, and actuable means connected to the hook means and mounted to the handle for moving, in a first lower position of the actuable means, the hook means to a position alongside but laterally spaced from the component due to the resilient biasing means, and, when moved to a second higher position of the actuable means, for moving the hook means upwardly through the base member's openings, the hook means and base member openings being in camming relationship so as to cam the hook means, when moved upwardly, laterally inwardly against the action of the resilient biasing means so as to cause the hook ends to engage the component bottom, whereby upon lifting of the base member by the handle when the actuable member is in its second position the component can be extracted from the socket.

4. An extraction tool for a PCC component mounted in a socket as claimed in claim 3, wherein the actuable means comprises a generally U-shaped member whose ends are each connected to one of the hook means, the U-shaped member being constituted of outwardly-biased resilient spring wire which constitutes the resilient biasing means.

5. An extraction tool for a PCC component mounted in a socket as claimed in claim 4, wherein the openings in the base member are round holes and the tapered members are conical.

6. An extraction tool for PCC components mounted in a socket as claimed in claim 4, wherein the handle has a slot, and the U-shaped spring wire extends through the slot.

7. An extraction tool for PCC components mounted in a socket as claimed in claim 6, wherein the handle is configured as a fixed knob, and the center portion of the spring wire where it passes through the slot is located in a position such that one hand of a user when holding the handle can engage with the user's thumb the knob and with the user's fingers the spring wire and pull the wire upwardly with respect to the knob while lifting the tool.

8. An extraction tool for PCC components mounted in a socket as claimed in claim 3, wherein the camming means comprises tapered members connected to the hook means and located within the openings and engaging the opening surfaces such that upward movement of the hook means cams them laterally inwardly.

9. An extraction tool for PCC components mounted in a socket as claimed in claim 3, wherein the base member and handle are constituted of plastic having an electrically conductive surface, and an electrically conductive cushion is mounted at the underside of the cavity so as to cushion the component as it is extracted from the socket during operation of the tool.

* * * * *